(12) United States Patent
Murata et al.

(10) Patent No.: US 12,021,175 B2
(45) Date of Patent: Jun. 25, 2024

(54) DISPLAY DEVICE

(71) Applicant: SHARP KABUSHIKI KAISHA, Sakai (JP)

(72) Inventors: Koji Murata, Sakai (JP); Tokiyoshi Umeda, Sakai (JP); Yuto Tsukamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 422 days.

(21) Appl. No.: 17/437,810

(22) PCT Filed: Mar. 22, 2019

(86) PCT No.: PCT/JP2019/012254
§ 371 (c)(1),
(2) Date: Sep. 9, 2021

(87) PCT Pub. No.: WO2020/194410
PCT Pub. Date: Oct. 1, 2020

(65) Prior Publication Data
US 2022/0158045 A1   May 19, 2022

(51) Int. Cl.
*H01L 33/50* (2010.01)
(52) U.S. Cl.
CPC ................... *H01L 33/504* (2013.01)

(58) Field of Classification Search
CPC ... H01L 33/504; H01L 33/502; H01L 33/507; H10K 59/38; H05B 33/14; G02B 5/20; G09F 9/30
See application file for complete search history.

(56) References Cited

U.S. PATENT DOCUMENTS

| | | | |
|---|---|---|---|
| 2012/0326180 A1* | 12/2012 | Ohe | H10K 59/38 257/98 |
| 2013/0075692 A1* | 3/2013 | Naasani | H01L 33/501 257/E33.059 |
| 2015/0285969 A1* | 10/2015 | Kim | G02B 5/201 359/891 |
| 2017/0125650 A1* | 5/2017 | Pickett | C09K 11/02 |
| 2021/0013370 A1* | 1/2021 | Yan | H01L 33/501 |
| 2021/0296543 A1* | 9/2021 | Aoyama | G02B 5/20 |

FOREIGN PATENT DOCUMENTS

| | | | |
|---|---|---|---|
| JP | 2016004721 A | * | 1/2016 |
| JP | 2016039249 A | * | 3/2016 |
| JP | 2017016792 A | * | 1/2017 |
| WO | 2011/104936 A1 | | 9/2011 |

* cited by examiner

*Primary Examiner* — Sitaramarao S Yechuri
(74) *Attorney, Agent, or Firm* — ScienBiziP, P.C.

(57) ABSTRACT

A display device includes a light-emitting layer and a red converting layer, the red converting layer includes a binder resin, red luminescent bodies, and In nanoparticles, each of the In nanoparticles includes a core and a silica shell, and the silica shell includes blue luminescent bodies emitting light having a wavelength shorter than that of red luminescent bodies.

21 Claims, 10 Drawing Sheets

DISPLAY DEVICE

TECHNICAL FIELD

The disclosure relates to a display device including a light-emitting layer that emits light and a color converting layer that converts a color of light emitted from the light-emitting layer.

BACKGROUND ART

In the related art, a display device is known that includes a light-emitting layer that emits light, and a color converting layer that converts a color of light emitted from the light-emitting layer, the color converting layer including indium nanoparticles and luminescent bodies (PTL 1). In this display device, for example, an electric field generated in the vicinity of the indium nanoparticle that absorbs near-ultraviolet light radiated as excitation light based on a resonant wavelength of a near ultraviolet region acts on red luminescent bodies, for example, in a converting layer that converts a red color, and the red luminescent body acted on by the electric field generated in the vicinity of the indium nanoparticle emits light.

CITATION LIST

Patent Literature

PTL 1: WO 2011/104936 (published on Sep. 1, 2011)

SUMMARY

Technical Problem

However, an overlap area between an electric field wavelength region of the indium nanoparticle and an absorption wavelength region of the red luminescent bodies is small, and thus, a light emission intensity of red luminescent bodies is disadvantageously not sufficiently strong.

An aspect of the disclosure has an object to provide a display device having a strong light emission intensity of a luminescent body acted on by an electric field of a metal nanoparticle that absorbs excitation light.

Solution to Problem

A display device according to the disclosure includes a light-emitting layer, and a color converting layer configured to convert a color of light emitted from the light-emitting layer, wherein the color converting layer includes a binder resin made of a transparent resin, first luminescent bodies dispersed in the binder resin, and metal nanoparticles dispersed in the binder resin, the metal nanoparticles include a core, and a first shell covering the core, and the first shell includes a second luminescent body configured to emit light having a wavelength shorter than that of the first luminescent bodies.

Advantageous Effects of Disclosure

According to an aspect of the disclosure, it is possible to strengthen a light emission intensity of a luminescent body acted on by an electric field of a metal nanoparticle that absorbs excitation light.

BRIEF DESCRIPTION OF DRAWINGS

FIG. 1(a) is a schematic cross-sectional view of a display device according to a first embodiment, (b) is a schematic cross-sectional view of a red converting layer provided to the display device, (c) is a schematic cross-sectional view of a green converting layer provided to the display device, and (d) is a schematic cross-sectional view of a blue converting layer provided to the display device.

FIG. 3(a) is a graph showing a relationship between a light emission intensity and a wavelength of an excitation light for the blue luminescent body, (b) is a graph showing a relationship between a light emission intensity and a wavelength of an excitation light for a green luminescent body provided in the color converting layer, and (c) is a graph showing a relationship between a light emission intensity and a wavelength of an excitation light for the red luminescent body.

FIG. 6(a) is a schematic cross-sectional view of a display device according to a comparative example, (b) is a schematic cross-sectional view of a red converting layer provided to the display device, (c) is a schematic cross-sectional view of a green converting layer provided to the display device, and (d) is a schematic cross-sectional view of a blue converting layer provided to the display device.

FIG. 8(a) is a schematic cross-sectional view of a display device according to a second embodiment, (b) is a schematic cross-sectional view of a red converting layer provided to the display device, (c) is a schematic cross-sectional view of a green converting layer provided to the display device, and (d) is a schematic cross-sectional view of a blue converting layer provided to the display device.

FIG. 9(a) is a schematic cross-sectional view of a display device according to a third embodiment, (b) is a schematic cross-sectional view of a red converting layer provided to the display device, (c) is a schematic cross-sectional view of a green converting layer provided to the display device, and (d) is a schematic cross-sectional view of a blue converting layer provided to the display device.

FIG. 10(a) is a schematic cross-sectional view of a display device according to a fourth embodiment, (b) is a schematic cross-sectional view of a red converting layer provided to the display device, (c) is a schematic cross-sectional view of a green converting layer provided to the display device, and (d) is a schematic cross-sectional view of a blue converting layer provided to the display device.

DESCRIPTION OF EMBODIMENTS

In the present embodiment, "color conversion" refers to the conversion of color from near-ultraviolet light, and is also referred to as "wavelength conversion". A "color converting layer" is also referred to as a "wavelength converting layer".

First Embodiment

FIG. 1(a) is a schematic cross-sectional view of a display device 1 according to a first embodiment, (b) is a schematic cross-sectional view of a red converting layer 3R provided to the display device 1, (c) is a schematic cross-sectional view of a green converting layer 3G provided to the display device 1, and (d) is a schematic cross-sectional view of a blue converting layer 3B provided to the display device 1.

The display device 1 includes a light-emitting layer 2 that emits near-ultraviolet light 11 (light) and a color converting layer 3 that converts a color of near-ultraviolet light 11 emitted from the light-emitting layer 2. The light-emitting layer 2 is formed on a reflective electrode layer 12, and a transparent electrode layer 13 is formed between the light-emitting layer 2 and the color converting layer 3. The light-emitting layer 2 is, for example, an organic layer that emits near-ultraviolet light (from 320 nm to 420 nm), but is not limited thereto, and may be an inorganic layer. Examples of materials of the light-emitting layer 2 include a triazole-based derivative TAZ.

The color converting layer 3 includes the red converting layer 3R that converts the near-ultraviolet light 11 into red light, the green converting layer 3G that converts the near-ultraviolet light 11 into green light, and the blue converting layer 3B that converts the near-ultraviolet light 11 into blue light. The near-ultraviolet light 11 preferably has a wavelength from 320 nm to 420 nm.

Pixels corresponding to the light-emitting layer 2 and the color converting layer 3 include at least a red subpixel 9R including the red converting layer 3R, a green subpixel 9G including the green converting layer 3G, and a blue subpixel 9B including the blue converting layer 3B. A transistor for emission of the light-emitting layer 2 is provided in units of pixels.

As illustrated in FIG. 1(b), the red converting layer 3R includes a binder resin 10 made of a transparent resin, red luminescent bodies 4R (first luminescent bodies) dispersed within the binder resin 10, and In (indium) nanoparticles 6 (metal nanoparticles) dispersed within the binder resin 10.

This In nanoparticle 6 has a core 7 and a silica shell 8 (first shell) covering the core 7. The silica shell 8 includes blue luminescent bodies 5B (second luminescent bodies) and green luminescent bodies 5G (second luminescent bodies) that emit light having a wavelength shorter than that of the red luminescent bodies 4R, and red luminescent bodies 5R. In the example, the silica shell 8 includes the blue luminescent bodies 5B and the green luminescent bodies 5G as the second luminescent bodies, but the silica shell 8 may include either the blue luminescent bodies 5B or the green luminescent bodies 5G as the second luminescent bodies.

When the red converting layer 3R is irradiated with the near-ultraviolet light 11 from the light-emitting layer 2, red light is emitted from the red converting layer 3R through two types of paths of energy transfer paths P1 and P2.

In the energy transfer path P1, firstly, the In nanoparticle 6 efficiently absorbs the near-ultraviolet light 11 due to a surface plasmon resonance (abbreviated as SPR) phenomenon to generate an electric field in the vicinity of the In nanoparticle 6. The electric field generated in the vicinity of the In nanoparticle 6 has a large overlap area between an electric field wavelength region of the In nanoparticle and an absorption wavelength region of the blue luminescent bodies 5B, and thus, acts the most strongly on the blue luminescent body 5B among the red luminescent body 5R, the blue luminescent body 5B, and the green luminescent body 5G. After that, the energy is transferred from the blue luminescent body 5B to the green luminescent body 5G, and then, from the green luminescent body 5G to the red luminescent body 5R due to fluorescence resonance energy transfer (abbreviated as FRET, or also referred to as Förster resonance energy transfer) to finally emit red light from the red luminescent body 5R.

In the energy transfer path P2, the red luminescent body 4R emits red light based on the near-ultraviolet light 11.

According to this configuration, the near-ultraviolet light 11 can be efficiently absorbed by the In nanoparticle 6, and the energy is transferred from the blue luminescent body 5B to the green luminescent body 5G, and from the green luminescent body 5G to the red luminescent body 5R to efficiently emit the red light.

As illustrated in FIG. 1(c), the green converting layer 3G includes the binder resin 10, green luminescent bodies 4G (first luminescent bodies) dispersed within the binder resin 10, and the In nanoparticles 6 (metal nanoparticles) dispersed within the binder resin 10.

This In nanoparticle 6 has the core 7 and the silica shell 8 (first shell) covering the core 7. The silica shell 8 includes the blue luminescent bodies 5B (second luminescent bodies) that emit light having a wavelength shorter than that of the green luminescent bodies 4G, and the green luminescent bodies 5G.

When the green converting layer 3G is irradiated with the near-ultraviolet light 11 from the light-emitting layer 2, green light is emitted from the green converting layer 3G through two types of paths of the energy transfer paths P1 and P2.

In the energy transfer path P1, firstly, the In nanoparticle 6 efficiently absorbs the near-ultraviolet light 11 due to the surface plasmon resonance phenomenon to generate an electric field in the vicinity of the In nanoparticle 6. The electric field generated in the vicinity of the In nanoparticle 6 has a large overlap area between the electric field wavelength region of the In nanoparticle 6 and the absorption wavelength region of the blue luminescent bodies 5B, and thus, acts more strongly on the blue luminescent body 5B among the blue luminescent body 5B and the green luminescent body 5G. After that, the energy is transferred from the blue luminescent body 5B to the green luminescent body 5G due to the fluorescence resonance energy transfer to finally emit green light from the green luminescent body 5G.

In the energy transfer path P2, the green luminescent body 4G emits green light based on the near-ultraviolet light 11.

According to this configuration, the near-ultraviolet light 11 can be efficiently absorbed by the In nanoparticle 6, and the energy is transferred from the blue luminescent body 5B to the green luminescent body 5G to efficiently emit the green light.

As illustrated in FIG. 1(d), the blue converting layer 3B includes the binder resin 10, blue luminescent bodies 4B dispersed within the binder resin 10, and the In nanoparticles 6 dispersed within the binder resin 10. This In nanoparticle 6 has the core 7 and the silica shell 8 covering the core 7.

When the blue converting layer 3B is irradiated with the near-ultraviolet light 11 from the light-emitting layer 2, blue light is emitted from the blue converting layer 3B through one type of path of the energy transfer path P2. In the energy transfer path P2, the blue luminescent body 4B emits blue light based on the near-ultraviolet light 11.

In the fluorescence resonance energy transfer, energy is transferred in a non-emitting route, which is a transition route different from a route for the light emission. At this time, an energy transfer efficiency varies depending on distances between the red luminescent body 5R, the blue luminescent body 5B, and the green luminescent body 5G. Thus, in the fluorescence resonance energy transfer, the light emission of the blue luminescent body 5B and the green luminescent body 5G is not problematic.

As for concentrations of the red luminescent bodies 5R, the green luminescent bodies 5G, and the blue luminescent bodies 5B within the silica shell 8, from the perspective of suppressing concentration quenching, it is preferable that the concentration of the red luminescent bodies 5R is higher than the concentration of the green luminescent bodies 5G, and the concentration of the green luminescent bodies 5G is higher than the concentration of the blue luminescent bodies 5B. When the concentration of the luminescent bodies that cause the concentration quenching is 1 or more and the concentration of less than 1 does not cause the concentration quenching, the energy can be efficiently transferred by setting the concentration of the red luminescent bodies 5R, the concentration of the green luminescent bodies 5G, and the concentration of the blue luminescent bodies 5B to 0.5:0.3:0.19, for example. That is, when (concentration of the red luminescent bodies 5R)+(concentration of the green luminescent bodies 5G)+(concentration of the blue luminescent bodies 5B)≥1, the concentration quenching occurs. The blue luminescent bodies 5B, the concentration of which is smaller but the overlap area with the In nanoparticle 6 of which is larger, can sufficiently absorb the energy. If the concentration of the red luminescent bodies 5R can be increased, the light emission route increases, leading to an increase in the light emission intensity.

A size of the In nanoparticle 6 is unified to 30 nm of a diameter between all of the red converting layer 3R, the green converting layer 3G, and the blue converting layer 3B. A film thickness of the silica shell 8 is also unified to 30 nm. As a result, the absorbance of the In nanoparticle 6 is greater than a scattering intensity. A concentration of the In nanoparticles 6 is preferably about $1 \times 10^{15}$/thickness 100 nm~1 cm$^2$ or less.

As for the concentrations of the red luminescent bodies 5R, the green luminescent bodies 5G, and the blue luminescent bodies 5B, the absorbances of the red luminescent bodies 5R, the green luminescent bodies 5G, and the blue luminescent bodies 5B in the red converting layer 3R are preferably 0.2, 0.3, and 0.5, respectively, the absorbances of the green luminescent bodies 5G and the blue luminescent bodies 5B in the green converting layer 3G are preferably 0.4 and 0.6, respectively, and the absorbance of the blue luminescent bodies 5B in the blue converting layer 3B in FIG. 8(d) described later is preferably equivalent to 1.

Figure 2:
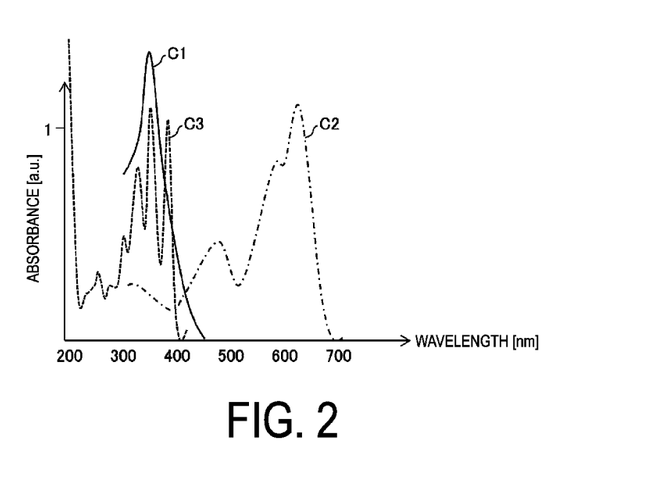
FIG. 2 is a graph showing a relationship between absorbances and wavelengths of excitation lights for a metal nanoparticle, a blue luminescent body, and a red luminescent body provided in the color converting layer of the display device.

FIG. 2 is a graph showing a relationship between the absorbances and wavelengths of excitation lights for the In nanoparticle 6, the blue luminescent body 5B, and the red luminescent body 5R provided in the color converting layer 3 of the display device 1. When the In nanoparticle 6 has a diameter of 10 nm and is spherical, a resonance frequency is near 350 nm as shown in FIG. 2 by a curve C1.

Figure 3:
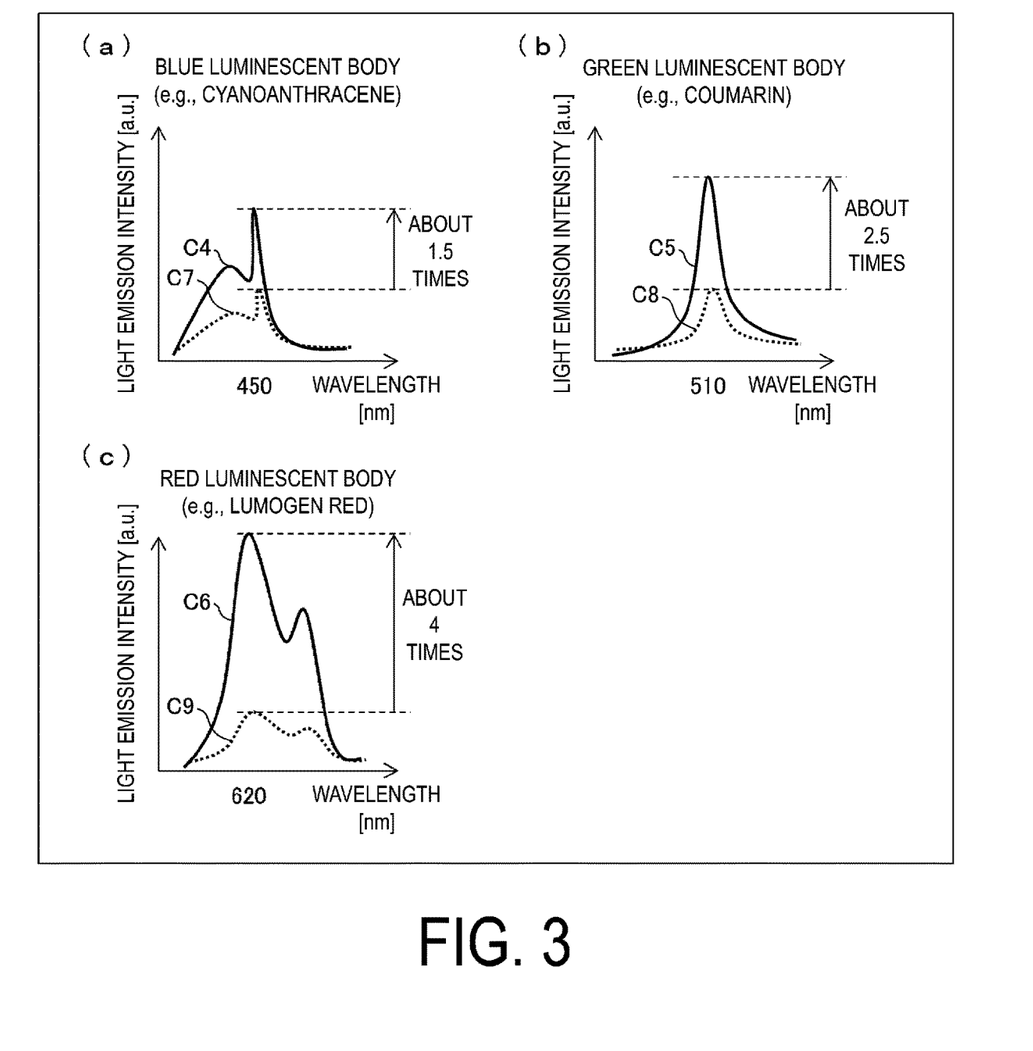

As shown in FIG. 2, an overlap area between a curve C3 and the curve C1 is larger than an overlap area between a curve C2 and the curve C1, the curve C3 corresponding to the blue luminescent body (anthracene) 5B having a wavelength from about 300 nm to 400 nm and an absorbance of about 1, the curve C1 corresponding to the In nanoparticles 6, the curve C2 corresponding to the red luminescent body (Lumogen Red 305) 5G having a wavelength from about 300 nm to 400 nm and an absorbance of about 0.25. Thus, the blue luminescent body 5B is more strongly acted on by the electric field of the In nanoparticles 6 than the red luminescent body 5R. Molar extinction coefficients of the blue luminescent body 5B and the red luminescent body 5R are about $10^7$, and a molar extinction coefficient of the In nanoparticle 6 is about $10^{10}$ FIG. 3(a) is a graph showing a relationship between a light emission intensity and a wavelength of an excitation light for the blue luminescent body 5B, (b) is a graph showing a relationship between a light emission intensity and a wavelength of an excitation light for the green luminescent body 5G, and (c) is a graph showing a relationship between a light emission intensity and a wavelength of an excitation light for the red luminescent body 5R. Solid lines C4, C5, and C6 indicate the relationships in the display device 1 according to the first embodiment, and dashed lines C7, C8, and C9 indicate the relationships in the known display device described in the above section of the background art.

Each of these graphs represents a predicted value obtained by multiplying a plasmon resonance effect in which the light emission intensity is considered to be several to several tens of times as a general value and a luminescent body Förster energy effect in which the light emission intensity is considered to be several times as a general value.

As for the blue luminescent body 5B, as shown in FIG. 3(a), the light emission intensity increases by about 1.5 times the known light emission intensity. As for the green luminescent body 5G, as shown in FIG. 3(b), the light emission intensity increases by about 2.5 times the known light emission intensity. As for the red luminescent body 5R, as shown in FIG. 3(c), the light emission intensity increases by about 4 times the known light emission intensity. The blue luminescent body 5B includes cyanoanthracene, for example. The green luminescent body 5G includes coumarin, for example. The red luminescent body 5R includes Lumogen red, for example.

In the related art, in particular, the red converting layer 3R contains only the plasmon resonance particles and the red luminescent bodies (one type). For this reason, the electric field of the plasmon resonance particle due to excitation light cannot sufficiently act on the red luminescent body, and as a result, efficient light emission is not possible. In the present embodiment, the electric field generated by the In nanoparticle 6 acts on the blue luminescent body 5B having the larger overlap area, and then, the energy is transferred from the blue luminescent body 5B to the green luminescent body 5G, and from the green luminescent body 5G to the red luminescent body 5R. As a result, the light emission efficiency increases more compared to the known art The silica shell 8 prevents aggregation of the In nanoparticles 6 or chemically modifies a surface of the In nanoparticle 6 to be adequately deactivated. This improves a thermodynamic stability and a chemical stability of the In nanoparticle 6 and maintains optical characteristics of the In nanoparticle 6. In addition, the silica shell 8 made to carry the red luminescent bodies 5R, the green luminescent bodies 5G, and the blue luminescent bodies 5B allows the red luminescent bodies 5R, the green luminescent bodies 5G, and the blue luminescent bodies 5B to be disposed in close proximity to the core 7. Therefore, a display device having a high luminance can be manufactured using even a small amount of the material used for the red luminescent body 5R, the green luminescent body 5G, and the blue luminescent body 5B.

In the present embodiment, the red luminescent bodies 5R, the green luminescent bodies 5G, and the blue luminescent bodies 5B are carried inside the silica shell 8, where the respective luminescent bodies 5R, 5G, and 5B are maintained at some distances so that the Förster resonance energy transfer (fluorescence resonance energy transfer) occurs.

In order to suppress the concentration quenching, the concentrations of the respective luminescent bodies preferably meet the concentration of the red luminescent bodies 5R>the concentration of the green luminescent bodies 5G>the concentration of the blue luminescent bodies 5B. For example, when the concentration of the red luminescent bodies 5R=the concentration of the green luminescent bodies 5G=the concentration of the blue luminescent bodies 5B, the efficiency of the Förster resonance energy transfer is not good.

The red luminescent bodies 5R, the green luminescent bodies 5G, and the blue luminescent bodies 5B carried inside the silica shell 8 are maintained at fixed positions with no change in the distances therebetween due to moving during use of the display device 1.

The silica shell 8 may be made from a material other than $SiO_2$, for example, $TiO_2$, so long as it is a transparent material.

For example, the reason why in the red converting layer 3R, the green luminescent bodies 5G and the blue luminescent bodies 5B do not emit lights and only the red luminescent bodies 5R emit light may be derived from the fact that in a case that the red luminescent bodies 5R, the green luminescent bodies 5G, and the blue luminescent bodies 5B are in close proximity at the distances so that the Förster resonance energy transfer occurs, the non-emitting transition route is higher in a speed coefficient than the light emission transition route.

Figure 4:
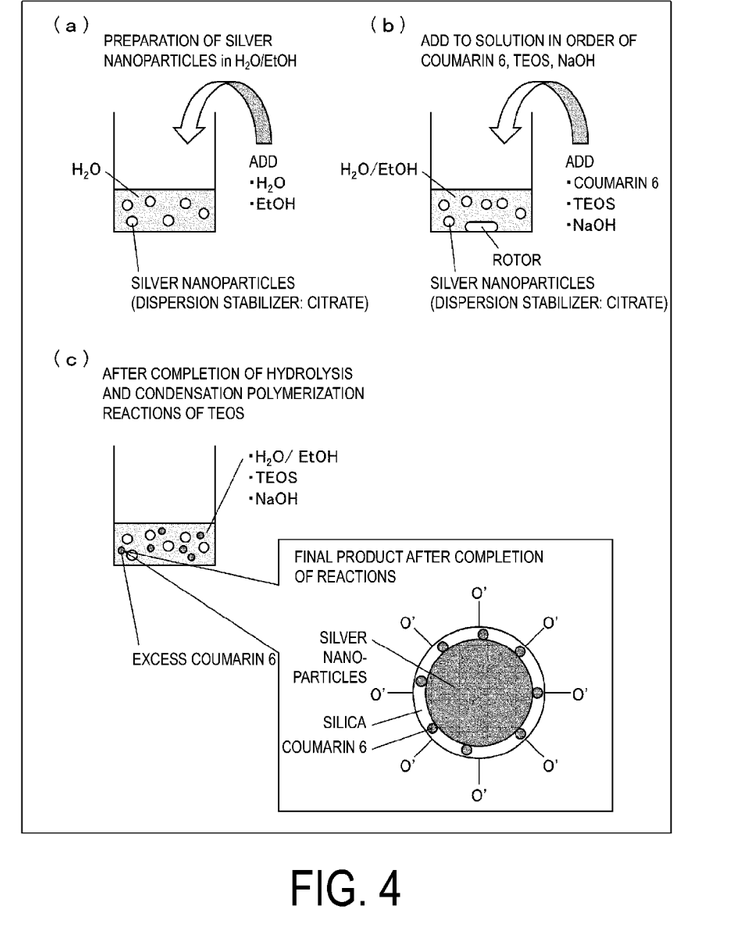
FIGS. 4(a) to 4(c) are drawings for illustrating a manufacturing method of the metal nanoparticles.

FIGS. 4(a) to 4(c) are drawings for illustrating a manufacturing method of the metal nanoparticles. Hydrolysis and condensation polymerization reactions of tetraethyl orthosilicate (TEOS) were used as a way of forming a silica shell.

First, as illustrated in FIG. 4(a), an $H_2O$/EtOH mixture was added to a silver nanoparticle aqueous solution with citrate (particle size 60 nm, $1.7 \times 10^{10}$/mL: Sigma-Aldrich table).

Then, as illustrated in FIG. 4(b), coumarin 6 (0.2 ml, $1.0 \times 10^{-2}$ Mln EtOH) was added to the solution prepared above, and the mixture was thoroughly stirred using a rotor. After that a temperature of a water bath was constant at 35° C. After 15 minutes of the addition of TEOS, base catalyst NaOH (0.2 ml, 0.1 M) was added and the solution was stirred and reacted for about 6 hours. At this time, a concentration of water with respect to ethanol was set to 55.6 mol/L. A volume of the prepared solution was 2 mL.

Next, as illustrated in FIG. 4(c), after the reaction, a silica-coated silver nanoparticle solution containing coumarin 6 is obtained. However, due to the presence of impurities (excess coumarin 6, NaOH, etc.), the following procedure was performed.

The excess coumarin 6 present in the liquid is removed by centrifuging the solution prepared above. That is, centrifugation can separate a precipitate (reactant) from a supernatant liquid, so the supernatant liquid is collected and then diluted with water. The above was repeated several times to remove the excess coumarin 6, and silica-coated silver nanoparticles containing coumarin 6 (final product) having a silica thickness of 5 nm were prepared.

Here, when the particles are dispersed in water, OH on the surface of the silica undergoes a deprotonation reaction to charge O and H. Note that, as for the silica-coated silver nanoparticles containing coumarin 6 prepared by the above procedure, because a particle size distribution before and after being coated with silica can be measured by Dynamic Light Scattering (DLS) measurement, the mode of particle size obtained from the measured distribution can be seen.

Figure 5:
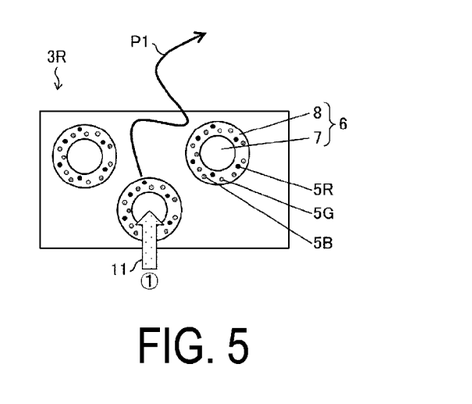
FIG. 5 is a schematic cross-sectional view of a modification example of the red converting layer provided to the display device.

FIG. 5 is a schematic cross-sectional view of a modification example of the red converting layer 3R provided to the display device 1. Constituent elements similar to the constituent elements described above are given the same reference numerals, and detailed descriptions thereof are not repeated.

A point different from the red converting layer 3R in FIG. 1(b) described above is that the red luminescent bodies 4R are not present. The red luminescent bodies 4R need not be provided so long as the blue luminescent bodies 5B, the green luminescent bodies 5G, and the red luminescent bodies 5R are provided in the silica shell 8 of the In nanoparticle 6 so that energy is transferred from the blue luminescent body 5B via the green luminescent body 5G to the red luminescent body 5R due to fluorescence resonance energy transfer.

In this case, when the red converting layer 3R is irradiated with the near-ultraviolet light 11 from the light-emitting layer 2, red light is emitted from the red converting layer 3R through one type of path of the energy transfer path P1.

Figure 6:
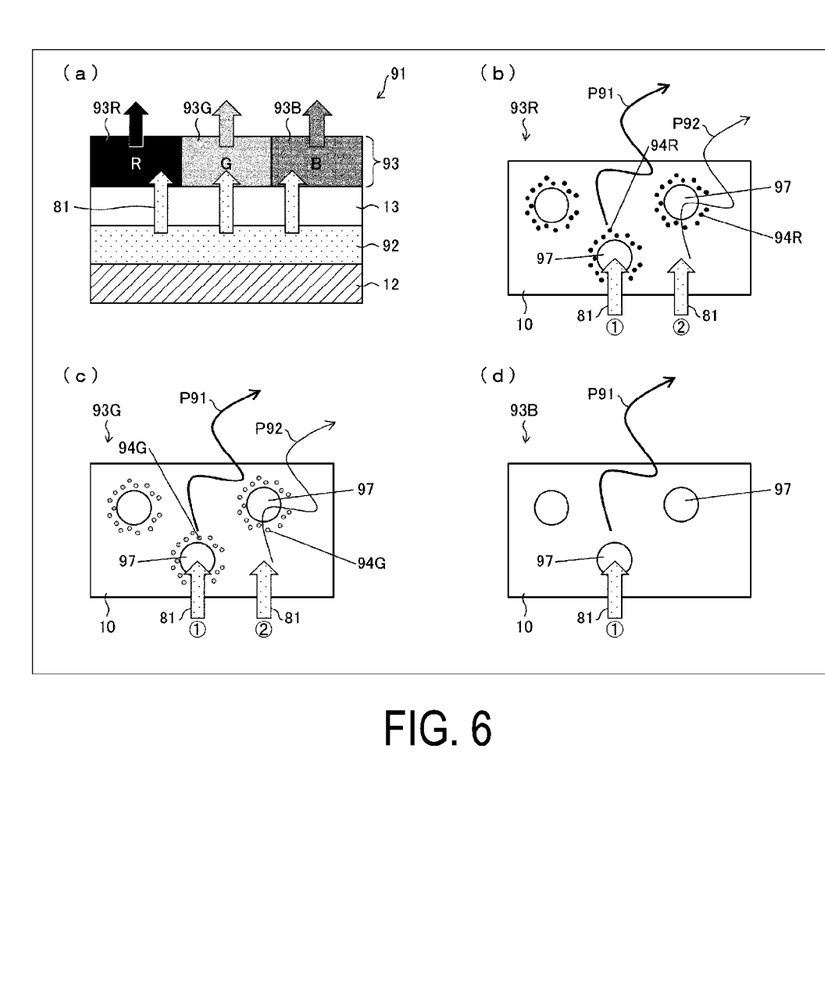

FIG. 6(a) is a schematic cross-sectional view of a display device 91 according to a comparative example, (b) is a schematic cross-sectional view of a red converting layer 93R provided to the display device 91, (c) is a schematic cross-sectional view of a green converting layer 93G provided to the display device 91, and (d) is a schematic cross-sectional view of a blue converting layer 93B provided to the display device 91. Constituent elements similar to the constituent elements described above are given the same reference numerals, and detailed descriptions thereof are not repeated.

The display device 91 includes a light-emitting layer 92 that emits blue light 81 and a color converting layer 93 that converts a color of the blue light 81 emitted from the light-emitting layer 92. The color converting layer 93 includes the red converting layer 93R that converts the color of the blue light 81 into red, the green converting layer 93G that converts the color of the blue light 81 into green, and the blue converting layer 93B that converts the color of the blue light 81 into blue.

As illustrated in FIG. 6(b), the red converting layer 93R includes the binder resin 10, red luminescent bodies 94R dispersed within the binder resin 10, and silver nanoparticles 97 dispersed within the binder resin 10.

When the red converting layer 93R is irradiated with the blue light 81 from the light-emitting layer 92, red light is emitted from the red converting layer 93R through two types of paths of energy transfer paths P91 and P92.

In the energy transfer path P91, firstly, the silver nanoparticle 97 efficiently absorbs the blue light 81 due to the surface plasmon resonance phenomenon to generate an electric field in the vicinity of the silver nanoparticle 97. Then, the electric field generated in the vicinity of the silver nanoparticle 97 acts on the red luminescent bodies 94R dispersed within the binder resin 10. Next, the red luminescent body 94R emits red light.

In the energy transfer path P92, the red luminescent body 94R emits red light based on the blue light 81.

In this configuration, the energy transfer efficiency from the silver nanoparticle 97 to the red luminescent body 94R is poor, and the intensity of the red light emitted by the red luminescent body 94R is low.

As illustrated in FIG. 6(c), the green converting layer 93G includes the binder resin 10, green luminescent bodies 94G dispersed within the binder resin 10, and the silver nanoparticles 97 dispersed within the binder resin 10.

When the green converting layer 93G is irradiated with the blue light 81 from the light-emitting layer 92, green light is emitted from the green converting layer 93G through two types of paths of the energy transfer paths P91 and P92.

In the energy transfer path P91, firstly, the silver nanoparticle 97 efficiently absorbs the blue light 81 due to the surface plasmon resonance phenomenon to generate an electric field in the vicinity of the silver nanoparticle 97. Then, the electric field generated in the vicinity of the silver nanoparticle 97 acts on the green luminescent bodies 94G dispersed within the binder resin 10. Next, the green luminescent body 94G emits green light.

In the energy transfer path P92, the green luminescent body 94G emits green light based on the blue light 81.

In this configuration, the energy transfer efficiency from the silver nanoparticle 97 to the green luminescent body 94G is poor, and the intensity of the green light emitted by the green luminescent body 94G is low.

As illustrated in FIG. 6(d), the blue converting layer 93B includes the binder resin 10, and the silver nanoparticles 97 dispersed within the binder resin 10.

When the blue converting layer 93B is irradiated with the blue light 81 from the light-emitting layer 92, blue light is emitted from the blue converting layer 93B through one type of path of the energy transfer path P91.

In the energy transfer path P91, the silver nanoparticle 97 efficiently absorbs the blue light 81 due to the surface plasmon resonance phenomenon to emit blue scattered light.

Figure 7:
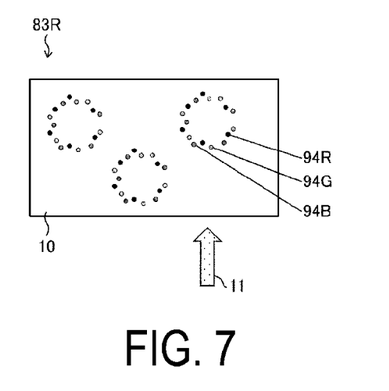
FIG. 7 is a schematic cross-sectional view of a red converting layer provided to a display device according to another comparative example.

FIG. 7 is a schematic cross-sectional view of a red converting layer 83R provided to a display device according to another comparative example. Constituent elements similar to the constituent elements described above are given the same reference numerals, and detailed descriptions thereof are not repeated.

As illustrated in FIG. 7, the red converting layer 83R includes the binder resin 10, the red luminescent bodies 94R, green luminescent bodies 94G, and blue luminescent bodies 94B dispersed within the binder resin 10. The red luminescent bodies 94R, the green luminescent bodies 94G, and the blue luminescent bodies 94B are disposed in close proximity to each other.

When the red converting layer 83R is irradiated with the near-ultraviolet light 11 from the light-emitting layer 2, the blue luminescent body 94B absorbs more near-ultraviolet light 11 than the red luminescent body 94R and the green luminescent body 94G. The energy of the near-ultraviolet light 11 is transferred in the order of the blue luminescent body 94B, the green luminescent body 94G, and the red luminescent body 94R due to the fluorescence resonance energy transfer. Then, red light is emitted from the red luminescent body 94R. However, because the near-ultraviolet light 11 cannot be sufficiently absorbed only by the blue luminescent body 94B, the light emission intensity of the red light from the red luminescent body 94R is insufficient.

Second Embodiment

FIG. 8(a) is a schematic cross-sectional view of a display device 1A according to a second embodiment, (b) is a schematic cross-sectional view of the red converting layer 3R provided to the display device 1A, (c) is a schematic cross-sectional view of the green converting layer 3G provided to the display device 1A, and (d) is a schematic cross-sectional view of a blue converting layer 3AB provided to the display device 1A. Constituent elements similar to the constituent elements described above are given the same reference numerals, and detailed descriptions thereof are not repeated.

Figure 1:
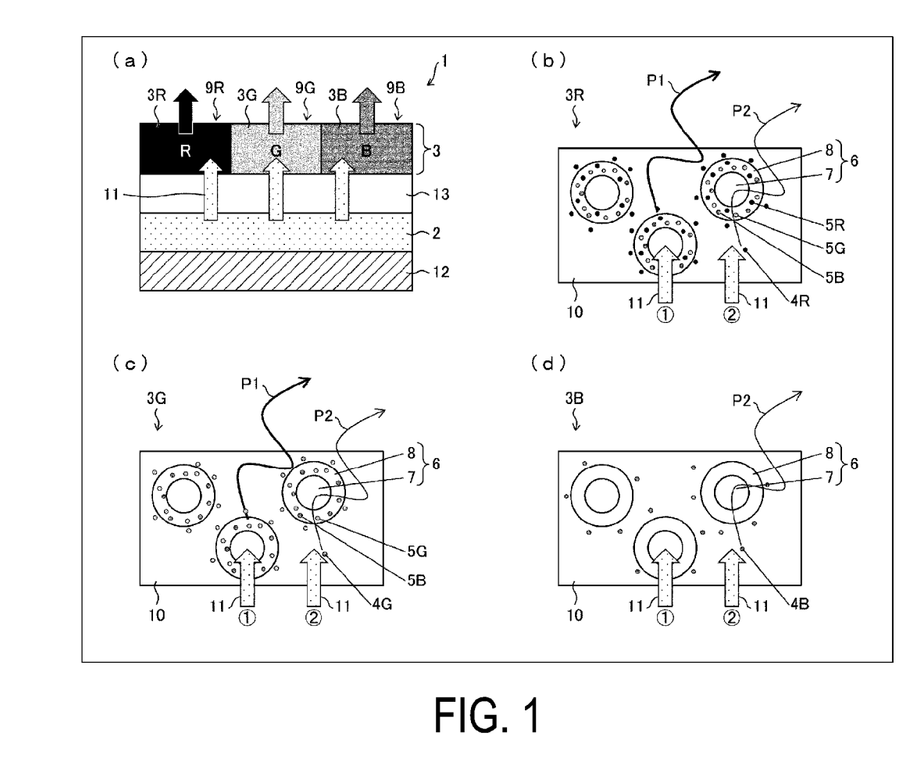

A point different from the display device 1 in FIG. 1 described above is that the blue luminescent bodies 5B are contained in the silica shell 8 of the In nanoparticle 6 included in the blue converting layer 3AB of the display device 1A.

When the blue converting layer 3AB is irradiated with the near-ultraviolet light 11 from the light-emitting layer 2, blue light is emitted from the blue converting layer 3AB through two types of paths of the energy transfer paths P1 and P2.

In the energy transfer path P1, firstly, the In nanoparticle 6 efficiently absorbs the near-ultraviolet light 11 due to the surface plasmon resonance phenomenon to generate an electric field in the vicinity of the In nanoparticle 6. Then, the electric field generated in the vicinity of the In nanoparticle 6 acts on the blue luminescent bodies 5B. After that, blue light is emitted from the blue luminescent body 5B.

In the energy transfer path P2, the blue luminescent body 4B emits blue light based on the near-ultraviolet light 11.

According to this configuration, because there are two types of paths of the energy transfer paths P1 and P2, the blue converting layer 3AB can increase the light emission intensity of blue light more than the blue converting layer 3B of FIG. 1(d) in which there is only one type of path of the energy transfer path P2.

Note that in this configuration, in addition to the blue luminescent bodies 5B, near-ultraviolet light luminescent bodies having a light emission wavelength smaller than the blue wavelength may be configured to be contained within the silica shell 8. Examples of materials of the near-ultraviolet light luminescent body include a triazole-based derivative TAZ.

Third Embodiment

Figure 9:
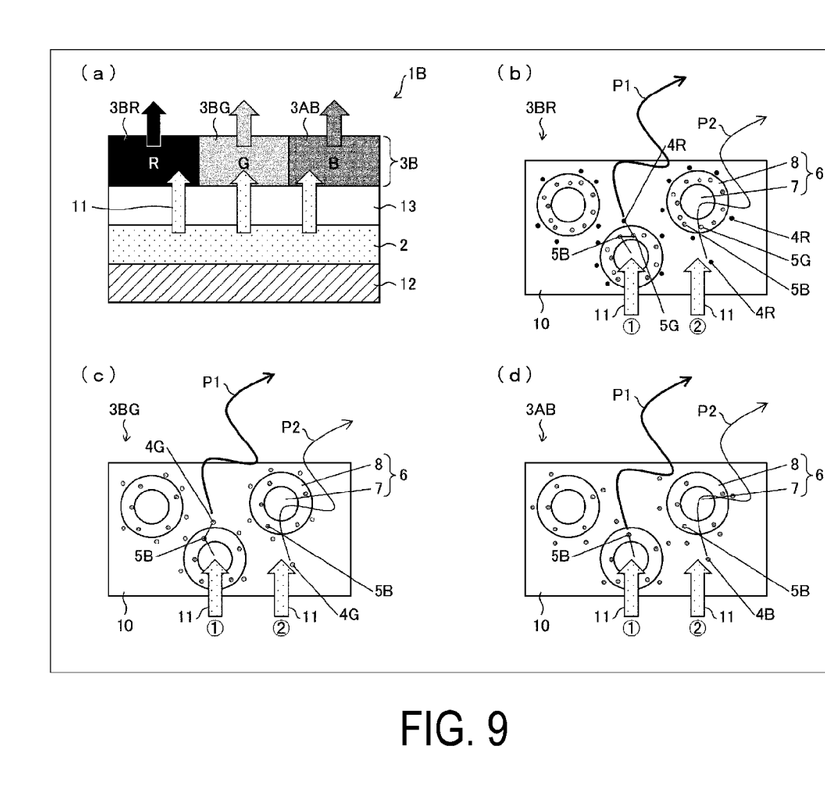

FIG. 9(a) is a schematic cross-sectional view of a display device 1B according to a third embodiment, (b) is a schematic cross-sectional view of a red converting layer 3BR provided to the display device 1B, (c) is a schematic cross-sectional view of a green converting layer 3BG provided to the display device 1B, and (d) is a schematic cross-sectional view of a blue converting layer 3AB provided to the display device 1B. Constituent elements similar to the constituent elements described above are given the same reference numerals, and detailed descriptions thereof are not repeated.

Figure 8:
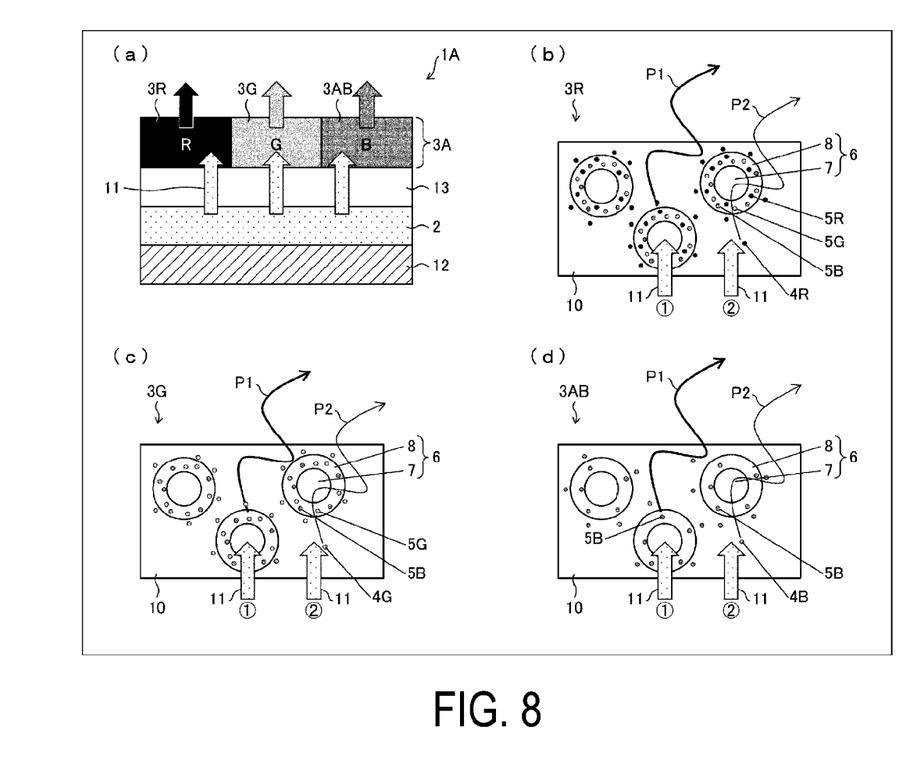

A point different from the display device 1A in FIG. 8 described above is that luminescent bodies emitting lights outward are not contained in the silica shell 8 of the In nanoparticle 6 in the red converting layer 3BR and the green converting layer 3BG. Specifically, the silica shell 8 of the In nanoparticle 6 included in the red converting layer 3BR contains the blue luminescent bodies 5B and the green luminescent bodies 5G, and does not contain the red luminescent bodies 5R emitting lights outward. Then, the red luminescent bodies 4R emitting lights outward are disposed outside the silica shell 8. The silica shell 8 of the In nanoparticle 6 included in the green converting layer 3BG contains the blue luminescent bodies 5B, and does not contain the green luminescent bodies 5G emitting lights outward. Then, the green luminescent bodies 4G emitting lights outward are disposed outside the silica shell 8.

When the red converting layer 3BR is irradiated with the near-ultraviolet light 11 from the light-emitting layer 2, red light is emitted from the red converting layer 3BR through two types of paths of the energy transfer paths P1 and P2.

In the energy transfer path P1, firstly, the In nanoparticle 6 efficiently absorbs the near-ultraviolet light 11 due to the surface plasmon resonance phenomenon to generate an electric field in the vicinity of the In nanoparticle 6. The electric field generated in the vicinity of the In nanoparticle 6 has a large overlap area between the electric field wavelength region of the In nanoparticle and the absorption wavelength region of the blue luminescent bodies 5B, and thus, acts more strongly on the blue luminescent body 5B among the blue luminescent body 5B and the green luminescent body 5G. After that, the energy is transferred from the blue luminescent body 5B to the green luminescent body 5G, and then, from the green luminescent body 5G to the red luminescent body 4R disposed outside the silica shell 8 due to the fluorescence resonance energy transfer to finally emit red light from the red luminescent body 4R.

In the energy transfer path P2, the red luminescent body 4R emits red light based on the near-ultraviolet light 11.

When the green converting layer 3BG is irradiated with the near-ultraviolet light 11 from the light-emitting layer 2, green light is emitted from the green converting layer 3BG through two types of paths of the energy transfer paths P1 and P2.

In the energy transfer path P1, firstly, the In nanoparticle 6 efficiently absorbs the near-ultraviolet light 11 due to the surface plasmon resonance phenomenon to generate an electric field in the vicinity of the In nanoparticle 6. Then, the electric field generated in the vicinity of the In nanoparticle 6 acts on the blue luminescent bodies 5B. After that, the energy is transferred from the blue luminescent body 5B to the green luminescent body 4G disposed outside the silica shell 8 due to the fluorescence resonance energy transfer to finally emit green light from the green luminescent body 4G.

In the energy transfer path P2, the green luminescent body 4G emits green light based on the near-ultraviolet light 11.

This can suppress the concentration quenching that is caused by the fact that the respective luminescent bodies inside the silica shell 8 are densely packed so that the fluorescence resonance energy transfer cannot be efficiently performed. Thus, the display device 1B can further increase the light emission intensity than the display device 1A of FIG. 8 described above.

Note that, similar to the blue converting layer 3B illustrated in FIG. 1, the blue converting layer 3AB may be configured such that the blue luminescent bodies 5B are not present inside the silica shell 8.

In the case that the luminescent bodies of two or more colors are disposed inside, like the red converting layer and the green converting layer, the partial quenching may be caused due to interaction between different molecules, but the luminescent bodies of only one color are disposed in the blue converting layer, where the concentration quenching is less likely to occur compared to the red converting layer and the green converting layer in which the luminescent bodies of two or more colors are blended. For this reason, the blue luminescent bodies 5B may be contained inside the silica shell 8 as in the blue converting layer 3AB.

Fourth Embodiment

Figure 10:
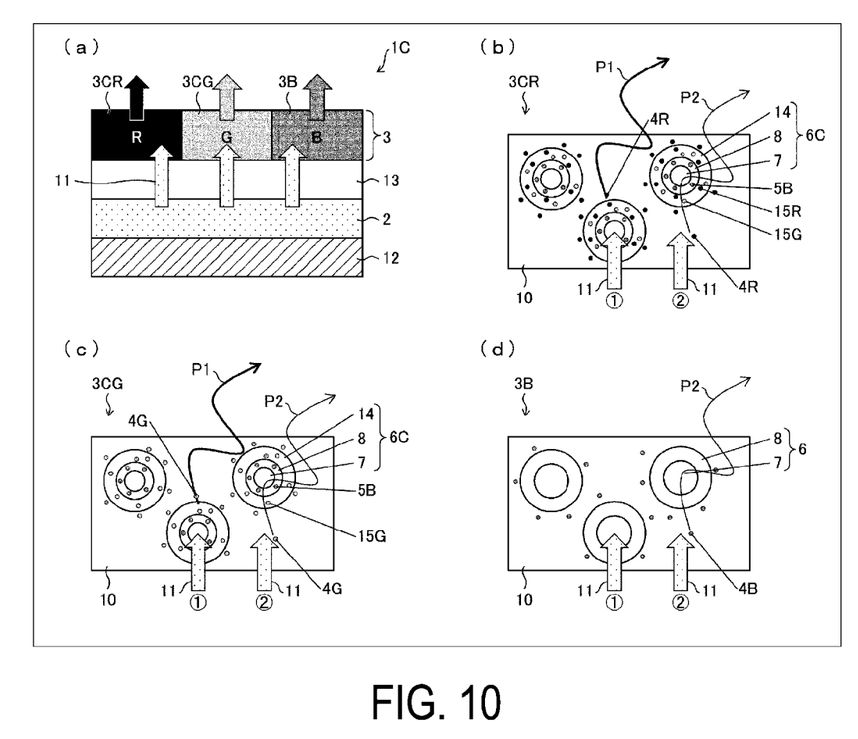

FIG. 10(a) is a schematic cross-sectional view of a display device 1C according to a fourth embodiment, (b) is a schematic cross-sectional view of a red converting layer 3CR provided to the display device 1C, (c) is a schematic cross-sectional view of a green converting layer 3CG provided to the display device 1C, and (d) is a schematic cross-sectional view of a blue converting layer 3B provided to the display device 1C. Constituent elements similar to the constituent elements described above are given the same reference numerals, and detailed descriptions thereof are not repeated.

A point different from the display device 1 in FIG. 1 described above is that double shell type In nanoparticles 6C are provided. Specifically, the In nanoparticle 6C included in the red converting layer 3CR includes the core 7, the silica shell 8 covering the core 7, and a second shell 14 covering the silica shell 8. The silica shell 8 contains the blue luminescent bodies 5B. The second shell 14 contains green luminescent bodies 15G (third luminescent bodies) and red luminescent bodies 15R (third luminescent bodies).

When the red converting layer 3CR is irradiated with the near-ultraviolet light 11 from the light-emitting layer 2, red light is emitted from the red converting layer 3CR through two types of paths of the energy transfer paths P1 and P2.

In the energy transfer path P1, firstly, the In nanoparticle 6C efficiently absorbs the near-ultraviolet light 11 due to the surface plasmon resonance phenomenon to generate an electric field in the vicinity of the In nanoparticle 6C. Then, the electric field generated in the vicinity of the In nanoparticle 6C acts on the blue luminescent bodies 5B carried inside the silica shell 8. After that, the energy is transferred from the blue luminescent body 5B to the green luminescent body 15G carried in the second shell 14, and then, from the green luminescent body 15G to the red luminescent body 15R carried inside the second shell 14 due to the fluorescence resonance energy transfer to finally emit red light from the red luminescent body 15R.

In the energy transfer path P2, the red luminescent body 4R emits red light based on the near-ultraviolet light 11.

When the green converting layer 3CG is irradiated with the near-ultraviolet light 11 from the light-emitting layer 2, green light is emitted from the green converting layer 3CG through two types of paths of the energy transfer paths P1 and P2.

In the energy transfer path P1, firstly, the In nanoparticle 6C efficiently absorbs the near-ultraviolet light 11 due to the surface plasmon resonance phenomenon to generate an electric field in the vicinity of the In nanoparticle 6C. Then, the electric field generated in the vicinity of the In nanoparticle 6C acts on the blue luminescent bodies 5B carried inside the silica shell 8. After that, the energy is transferred from the blue luminescent body 5B to the green luminescent body 15G carried inside the second shell 14 due to the fluorescence resonance energy transfer to finally emit green light from the green luminescent body 15G.

In the energy transfer path P2, the green luminescent body 4G emits green light based on the near-ultraviolet light 11.

The light-emitting layer according to the present embodiment is not particularly limited. The light-emitting layer may be a light-emitting layer provide with near-ultraviolet light as backlight and a liquid crystal as a shutter, or may be a self-luminous light-emitting layer of an organic light-emitting diode (OLED), an inorganic light-emitting diode (including a quantum dot light-emitting diode (QLED)), and the like.

Supplement

A display device according to a first aspect includes a light-emitting layer, and a color converting layer configured to convert a color of light emitted from the light-emitting layer, wherein the color converting layer includes a binder resin made of a transparent resin, first luminescent bodies dispersed in the binder resin, and metal nanoparticles dispersed in the binder resin, the metal nanoparticles include a core, and a first shell covering the core, and the first shell includes a second luminescent body configured to emit light having a wavelength shorter than that of the first luminescent bodies.

In a display device according to a second aspect, the light-emitting layer is configured to emit near-ultraviolet light.

In a display device according to a third aspect, the near-ultraviolet light has a wavelength from 320 nm to 420 nm.

In a display device according to a fourth aspect, the color converting layer includes at least a red converting layer configured to convert the color of the light into red, a green converting layer configured to convert the color of the light into green, and a blue converting layer configured to convert the color of the light into blue, and a pixel including the light-emitting layer and the color converting layer includes at least a red subpixel including the red converting layer, a green subpixel including the green converting layer, and a blue subpixel including the blue converting layer.

In a display device according to a fifth aspect, in the red subpixel, the first luminescent bodies include a red luminescent body configured to emit red light, and the second luminescent body includes at least one of a green luminescent body configured to emit green light and a blue luminescent body configured to emit blue light.

In a display device according to a sixth aspect, the second luminescent body includes the green luminescent body and the blue luminescent body.

In a display device according to a seventh aspect, the second luminescent body further includes the red luminescent body.

In a display device according to an eighth aspect, in the green subpixel, the first luminescent bodies includes a green luminescent body configured to emit green light, and the second luminescent body includes a blue luminescent body configured to emit blue light.

In a display device according to a ninth aspect, the second luminescent body further includes the green luminescent body.

In a display device according to a tenth aspect, in the blue subpixel, the blue converting layer includes a binder resin for blue made of a transparent resin, blue luminescent bodies configured to emit blue light and dispersed in the binder resin for blue, and metal nanoparticles for blue dispersed in the binder resin for blue, and the metal nanoparticles for blue include a core for blue, and a first shell for blue covering the core for blue.

In a display device according to an eleventh aspect, the first shell for blue includes the blue luminescent body.

In a display device according to a twelfth aspect, the metal nanoparticle further includes a second shell covering the first shell, and the second shell includes a third luminescent body configured to emit light having a wavelength longer than that of the second luminescent body.

In a display device according to a thirteenth aspect, in the red subpixel, the first luminescent bodies include a red luminescent body configured to emit red light, and the second luminescent body includes a blue luminescent body configured to emit blue light.

In a display device according to a fourteenth aspect, the second luminescent body further includes a green luminescent body configured to emit green light, and the third luminescent body includes the red luminescent body.

In a display device according to a fifteenth aspect, the third luminescent body includes the green luminescent body.

In a display device according to a sixteenth aspect, in the green subpixel, the first luminescent bodies include a green luminescent body configured to emit green light, and the second luminescent body includes a blue luminescent body configured to emit blue light.

In a display device according to a seventeenth aspect, the third luminescent body includes the green luminescent body.

In a display device according to an eighteenth aspect, the metal nanoparticles have a resonance wavelength at which the metal nanoparticles resonate with the near-ultraviolet light.

In a display device according to a nineteenth aspect, the metal nanoparticles exhibit a surface plasmon resonance phenomenon by light emitted from the light-emitting layer.

In a display device according to a twentieth aspect, the core includes indium or aluminum.

In a display device according to a twenty-first aspect, the first shell includes $SiO_2$ or $TiO_2$.

The disclosure is not limited to each of the embodiments described above, and various modifications may be made within the scope of the claims. Embodiments obtained by appropriately combining technical approaches disclosed in each of the different embodiments also fall within the technical scope of the disclosure. Furthermore, novel technical features can be formed by combining the technical approaches disclosed in each of the embodiments.

The invention claimed is:

1. A display device comprising:
a light-emitting layer; and
a color converting layer configured to convert a color of light emitted from the light-emitting layer,
wherein the color converting layer includes
a binder resin made of a transparent resin,
first luminescent bodies dispersed in the binder resin, and
metal nanoparticles unevenly dispersed in the binder resin,
the metal nanoparticles include
a core, and
a first shell covering the core, and
the first shell includes a second luminescent body configured to emit light having a wavelength shorter than a wavelength of each of the first luminescent bodies.

2. The display device according to claim 1,
wherein the light-emitting layer is configured to emit near-ultraviolet light.

3. The display device according to claim 2,
wherein the near-ultraviolet light has a wavelength from 320 nm to 420 nm.

4. The display device according to claim 2,
wherein the metal nanoparticles have a resonance wavelength at which the metal nanoparticles resonate with the near-ultraviolet light.

5. The display device according to claim 1,
wherein the color converting layer includes at least a red converting layer configured to convert the color of the light into red, a green converting layer configured to convert the color of the light into green, and a blue converting layer configured to convert the color of the light into blue, and
a pixel including the light-emitting layer and the color converting layer includes at least a red subpixel including the red converting layer, a green subpixel including the green converting layer, and a blue subpixel including the blue converting layer.

6. The display device according to claim 5,
wherein in the green subpixel, the first luminescent bodies include a green luminescent body configured to emit green light, and the second luminescent body includes a blue luminescent body configured to emit blue light.

7. The display device according to claim 6, wherein the second luminescent body further includes the green luminescent body.

8. The display device according to claim 1, wherein the metal nanoparticles exhibit a surface plasmon resonance phenomenon by light emitted from the light-emitting layer.

9. The display device according to claim 1, wherein the core includes indium or aluminum.

10. The display device according to claim 1, wherein the first shell includes $SiO_2$ or $TiO_2$.

11. A display device comprising:
a light-emitting layer; and
a color converting layer configured to convert a color of light emitted from the light-emitting layer,
wherein the color converting layer includes
a binder resin made of a transparent resin,
first luminescent bodies dispersed in the binder resin, and
metal nanoparticles dispersed in the binder resin,
the metal nanoparticles include
a core, and
a first shell covering the core,
the first shell includes a second luminescent body configured to emit light having a wavelength shorter than a wavelength of each of the first luminescent bodies,
the color converting layer includes at least a red converting layer configured to convert the color of the light into red, a green converting layer configured to convert the color of the light into green, and a blue converting layer configured to convert the color of the light into blue,
a pixel including the light-emitting layer and the color converting layer has at least a red subpixel including the red converting layer, a green subpixel including the green converting layer, and a blue subpixel including the blue converting layer, and
in the red subpixel,
the first luminescent bodies include a red luminescent body configured to emit red light, and
the second luminescent body includes at least one of a green luminescent body configured to emit green light and a blue luminescent body configured to emit blue light.

12. The display device according to claim 11, wherein the second luminescent body includes the green luminescent body and the blue luminescent body.

13. The display device according to claim 11, wherein the second luminescent body further includes the red luminescent body.

14. The display device according to claim 11, wherein in the blue subpixel,
the blue converting layer includes
a binder resin for blue made of a transparent resin,
blue luminescent bodies configured to emit blue light and dispersed in the binder resin for blue, and
metal nanoparticles for blue dispersed in the binder resin for blue, and the metal nanoparticles for blue include
a core for blue, and
a first shell for blue covering the core for blue.

15. The display device according to claim 14, wherein the first shell for blue includes the blue luminescent body.

16. A display device comprising:
a light-emitting layer; and
a color converting layer configured to convert a color of light emitted from the light-emitting layer,
wherein the color converting layer includes
a binder resin made of a transparent resin,
first luminescent bodies dispersed in the binder resin, and
metal nanoparticles dispersed in the binder resin,
the metal nanoparticles include
a core, and
a first shell covering the core,
the first shell includes a second luminescent body configured to emit light having a wavelength shorter than a wavelength of each of the first luminescent bodies,
the color converting layer includes at least a red converting layer configured to convert the color of the light into red, a green converting layer configured to convert the color of the light into green, and a blue converting layer configured to convert the color of the light into blue,
a pixel including the light-emitting layer and the color converting layer has at least a red subpixel including the red converting layer, a green subpixel including the green converting layer, and a blue subpixel including the blue converting layer,
the metal nanoparticles further include a second shell covering the first shell, and
the second shell includes a third luminescent body configured to emit light having a wavelength longer than a wavelength of the second luminescent body.

17. The display device according to claim 16, wherein in the red subpixel,
the first luminescent bodies include a red luminescent body configured to emit red light, and
the second luminescent body includes a blue luminescent body configured to emit blue light.

18. The display device according to claim 17, wherein the second luminescent body further includes a green luminescent body configured to emit green light, and
the third luminescent body includes the red luminescent body.

19. The display device according to claim 17, wherein the third luminescent body includes a green luminescent body.

20. The display device according to claim 16, wherein in the green subpixel,
the first luminescent bodies include a green luminescent body configured to emit green light, and
the second luminescent body includes a blue luminescent body configured to emit blue light.

21. The display device according to claim 20, wherein the third luminescent body includes the green luminescent body.

* * * * *